United States Patent
Engel et al.

(10) Patent No.: US 11,796,570 B2
(45) Date of Patent: Oct. 24, 2023

(54) METHOD FOR MONITORING A POWER LINE

(71) Applicant: Siemens Energy Global GmbH & Co. KG, Bayern (DE)

(72) Inventors: Thomas Engel, Aalen (DE); Josef Alois Birchbauer, Seiersberg (AT)

(73) Assignee: Siemens Energy Global GmbH & Co. KG, Bayern (DE)

( * ) Notice: Subject to any disclaimer, the term of this patent is extended or adjusted under 35 U.S.C. 154(b) by 183 days.

(21) Appl. No.: 17/431,158

(22) PCT Filed: Feb. 14, 2020

(86) PCT No.: PCT/EP2020/053880
§ 371 (c)(1),
(2) Date: Aug. 14, 2021

(87) PCT Pub. No.: WO2020/169468
PCT Pub. Date: Aug. 27, 2020

(65) Prior Publication Data
US 2022/0146555 A1    May 12, 2022

(30) Foreign Application Priority Data

Feb. 21, 2019 (EP) .................................... 19158605

(51) Int. Cl.
*G01R 15/14* (2006.01)
*G01R 15/20* (2006.01)
*G01R 31/08* (2020.01)
*G06T 7/00* (2017.01)
*H04N 7/18* (2006.01)
*H04N 23/73* (2023.01)

(52) U.S. Cl.
CPC ......... *G01R 15/142* (2013.01); *G01R 15/202* (2013.01); *G01R 15/205* (2013.01);
(Continued)

(58) Field of Classification Search
CPC .......... H04B 3/54; H04B 17/309; H02J 50/40
See application file for complete search history.

(56) References Cited

U.S. PATENT DOCUMENTS

| | | | |
|---|---|---|---|
| 4,818,990 A | 4/1989 | Fernandes | |
| 7,279,901 B2 | 10/2007 | Diehl | |

(Continued)

FOREIGN PATENT DOCUMENTS

| | | |
|---|---|---|
| CN | 1611960 A | 5/2005 |
| CN | 104422911 A | 3/2015 |

(Continued)

OTHER PUBLICATIONS

PCT International Search Report and Written Opinion of International Searching Authority dated May 18, 2020 corresponding to PCT International Application No. PCT/EP2020/053880 filed Feb. 14, 2020.

*Primary Examiner* — Jermele M Hollington
*Assistant Examiner* — Temilade S Rhodes-Vivour
(74) *Attorney, Agent, or Firm* — WOLTER VAN DYKE DAVIS, PLLC

(57) ABSTRACT

A method for monitoring a power line that carries electrical current, using a mobile inspection device, the mobile inspection device has a magnetic sensor and a camera, the method includes the following steps: measuring a magnetic field generated by the current, by the magnetic sensor; and capturing an image of the power line by the camera according to the measured magnetic field. A mobile inspection device, a computer program and a machine-readable storage medium implement the method.

12 Claims, 2 Drawing Sheets

(52) U.S. Cl.
CPC .......... *G01R 31/085* (2013.01); *G06T 7/0002* (2013.01); *H04N 7/188* (2013.01); *H04N 23/73* (2023.01); *G06T 2207/20212* (2013.01); *G06T 2207/30232* (2013.01)

(56) References Cited

U.S. PATENT DOCUMENTS

| | | | |
|---|---|---|---|
| 7,307,399 B2 * | 12/2007 | Furem | H02P 29/50 318/625 |
| 7,832,126 B2 * | 11/2010 | Koellner | E02F 9/262 37/348 |
| 9,759,788 B2 | 9/2017 | Eberler | |
| 2005/0007450 A1 | 1/2005 | Hill et al. | |
| 2009/0132100 A1 | 5/2009 | Shibata | |
| 2015/0225002 A1 | 4/2015 | Branka | |
| 2015/0131079 A1 * | 5/2015 | Heinonen | G06Q 10/0631 356/4.01 |
| 2015/0353196 A1 | 12/2015 | van Cruyningen et al. | |
| 2016/0216304 A1 * | 7/2016 | Sekelsky | B60L 53/126 |
| 2018/0095478 A1 * | 4/2018 | van Cruyningen | G01S 19/14 |

FOREIGN PATENT DOCUMENTS

| | | |
|---|---|---|
| CN | 105912024 A | 8/2016 |
| CN | 109115217 A | 1/2019 |
| EP | 2495166 A1 | 9/2012 |
| WO | 2005017550 A2 | 2/2005 |

* cited by examiner

METHOD FOR MONITORING A POWER LINE

CROSS REFERENCE TO RELATED APPLICATIONS

This application is the US National Stage of International Application No. PCT/EP2020/053880 filed 14 Feb. 2020, and claims the benefit thereof. The International Application claims the benefit of European Application No. EP19158605 filed 21 Feb. 2019. All of the applications are incorporated by reference herein in their entirety.

FIELD OF INVENTION

The invention relates to a method for monitoring a power line that carries an electric current, to a mobile inspection device, to a computer program and to a machine-readable storage medium.

BACKGROUND OF INVENTION

The laid-open specification US 2015/0225002 A1 discloses a drone comprising a sensor and a camera. The drone travels ahead of a train and inspects the track that is located ahead of the train.

The laid-open specification US 2015/0353196 A1 discloses a drone comprising a sensor, which can detect or measure an electromagnetic field of an overhead line.

The laid-open specification EP 2 495 166 A1 discloses a drone comprising a plurality of sensors and also a camera system.

The laid-open specification DE 10 2015 221 600 A1 discloses a method for monitoring and managing a power distribution system. The known method comprises the reception of sensor measurement data, which are detected by a mobile inspection device during an inspection of a power distribution system element in a power distribution system. The mobile inspection device comprises infrared cameras and audio sensors, which are set up to detect electrical resonances, humming or vibrations.

SUMMARY OF INVENTION

The object on which the invention is based can be considered that of providing a concept for efficiently monitoring a power line that carries an electric current.

This object is achieved by means of the respective subject matter of the independent claims. Advantageous configurations of the invention are the subject matter of respectively dependent subclaims.

According to a first aspect, provision is made for a method for monitoring a power line that carries an electric current, using a mobile inspection device, wherein the mobile inspection device comprises a magnetic field sensor and a camera, said method comprising the following steps: measuring a magnetic field that is generated by the current, by means of the magnetic field sensor, and capturing an image of the power line by means of the camera depending on the measured magnetic field.

According to a second aspect, provision is made for a mobile inspection device for monitoring a power line that carries an electric current, comprising: a magnetic field sensor, which is set up to measure a magnetic field that is generated by the current, and a camera, which is set up to capture an image of the power line depending on the measured magnetic field.

According to a third aspect, provision is made for a computer program, wherein the computer program comprises commands that prompt a computer to carry out a method in accordance with the first aspect when the computer program is executed by said computer.

According to a fourth aspect, provision is made for a machine-readable storage medium, on which the computer program according to the third aspect is stored.

The invention is based on the knowledge that instances of insulation damage in a power line that carries an electric current can lead to voltage flashovers. Such voltage flashovers can be accompanied by one or more flashes of light. Such flashes of light can be captured efficiently by means of a camera, such that it is thereby advantageously made possible to efficiently detect instances of insulation damage.

Voltage flashovers depend, in particular, on the electric current that flows through the power line. The electric current through the power line generates a magnetic field, which depends on the electric current. By measuring the magnetic field by means of the magnetic field sensor, it is therefore advantageously possible to obtain pieces of information, for example a phase, a frequency (in the case of an alternating current) and/or a current intensity, about the electric current. Based on these pieces of information, it is possible to efficiently identify, for example, the location of the power line and/or the time at which a voltage flashover and therefore a flash of light can be expected, provided the power line has an instance of insulation damage at this location. As a result thereof, it is advantageously made possible, for example, to operate the camera based on the location and/or time in order to be able to capture a flash of light. That is to say that provision is thus made for the camera to be operated based on the measured magnetic field in order to be able to capture a flash of light that results from a possible instance of insulation damage.

The technical advantage that the power line can be monitored efficiently is therefore brought about.

In one embodiment, the mobile inspection device is an element selected from the following group of vehicles: land vehicle, watercraft, aircraft. An aircraft is, for example, a drone.

According to one embodiment, the mobile inspection device is set up to be controlled remotely.

According to one embodiment, the mobile inspection device is additionally, or instead of remote control, set up for autonomous operation.

In one embodiment, a plurality of magnetic field sensors and/or a plurality of cameras are provided. Embodiments that are made in connection with one camera and/or one magnetic field sensor apply analogously to a plurality of cameras and/or a plurality of magnetic field sensors and vice versa.

In the case of a plurality of magnetic field sensors, these are identical or different. In the case of a plurality of cameras, these are identical or different.

In one embodiment, provision is made for the electric current to be an alternating current.

In one embodiment, provision is made for the electric current to be an alternating current, wherein a phase and/or a frequency of the electric current is identified based on the measured magnetic field, wherein the camera captures the image based on the identified phase and/or the identified frequency.

This thereby brings about the technical advantage, for example, that the image can be captured efficiently. Voltage flashovers generally occur close to a maximum of a network voltage, which in the case of an alternating current is an AC voltage, which is responsible for the flow of the electric current. It is therefore advantageously possible to identify by means of the phase and/or the frequency of the alternating current a location and/or a time at which a voltage flashover and therefore a flash of light could occur in the case of an instance of insulation damage at said location. The camera can therefore be operated efficiently in order to effect a capture, for example at the identified time and/or at the identified location.

According to one embodiment, provision is made for the capturing of an image to comprise multiple exposure of a frame.

This thereby brings about the technical advantage, for example, that a flash of light with a low light intensity can also be detected efficiently.

In accordance with a further embodiment, provision is made for the capturing to comprise exposure of multiple individual frames, which are added.

This thereby brings about the technical advantage, for example, that a flash of light with a low light intensity can also be detected efficiently.

According to one embodiment, provision is made for the multiple frames to be shifted with respect to one another for the addition in order to compensate for a movement of the mobile inspection device.

This thereby brings about the technical advantage, for example, that a movement of the mobile inspection device can be compensated for efficiently.

The addition of the multiple frames is carried out, for example, using a stitching method.

In one embodiment, for the capturing of the image, provision is made for only a specific subregion of an image sensor of the camera to be read out depending on an alignment of the magnetic field sensor relative to the power line.

This thereby brings about the technical advantage, for example, that less data has to be processed compared with the case that the entire image sensor is read out.

In particular, a region of interest (ROI) (in this case the specific subregion) is thus identified as the region of the image sensor to be read out based on the alignment of the magnetic field sensor relative to the power line.

In one embodiment, the camera comprises an image sensor.

In one embodiment, the camera is a UV camera. The camera is thus preferably set up to detect electromagnetic radiation in the ultraviolet (UV) range. The camera is thus set up, in particular, to capture UV images.

This thereby brings about the technical advantage, for example, that the flash of light can be detected efficiently. This is because such a flash of light usually has a high proportion of UV radiation.

In one embodiment provision is made for the mobile inspection device to comprise at least one acoustic sensor (that is to say one or more acoustic sensors), by means of which an airborne sound is measured, wherein the measured airborne sound is evaluated based on the identified phase and/or the identified frequency in order to detect an acoustic signal resulting from a voltage flashover.

This thereby brings about the technical advantage, for example, that instances of insulation damage can be detected efficiently. Voltage flashovers are generally accompanied by acoustic emissions, which can be detected as an acoustic signal by means of the acoustic sensor. In a manner analogous with the flash of light, these acoustic emissions depend on the voltage flashover and thereby on the electric current, with the result that, in a manner analogous with the flash of light, it is possible by measuring the magnetic field that is generated by the flowing electric current to be able to make a statement about the location and/or the time at which an acoustic signal can be expected.

In the case of an alternating current, the acoustic signal will correlate to a maximum of the network voltage, for example. In other words, an acoustic signal that has been measured, for example, at a minimum of the network voltage around the potential zero cannot originate from a voltage flashover.

According to one embodiment, provision is made for a plurality of acoustic sensors to be provided, wherein a triangulation is carried out based on the respective measured airborne sound in order to locate a source of the acoustic signal.

This thereby brings about the technical advantage, for example, that a source of the acoustic signal can be located efficiently. A source of the acoustic signal is thus located based on the performance of the triangulation. Locating means that a position or a location or a direction in relation to the mobile inspection device on the power line is identified.

In one embodiment, provision is made for a phase position of the electric current at the time of the detected voltage flashover to be identified, wherein a breakdown voltage is identified based on the identified phase position and a nominal voltage of the power line.

This thereby brings about the technical advantage, for example, that a defect severity of an instance of insulation damage can be identified efficiently.

In one embodiment, provision is made for the captured image to be evaluated in order to detect a voltage flashover, wherein, upon detection of a voltage flashover, the mobile inspection device and/or the camera are controlled in such a way that a location of a source of the detected voltage flashover can further be captured by means of the camera.

This thereby brings about the technical advantage, for example, that the location of the source of the detected voltage flashover can be detected efficiently and further investigated.

In one embodiment, provision is made for control signals for controlling a movement of the mobile inspection device to be generated and output based on the measured magnetic field in order to move the mobile inspection device along a course of the power line.

This thereby brings about the technical advantage, for example, that the mobile inspection device can be moved efficiently along the course of the power line.

In one embodiment, the power line is a high-voltage line.

In accordance with one embodiment, the power line is an insulation.

According to one embodiment, the power line is an overhead line.

According to one embodiment, the power line is part of a bundle of power lines, for example of three power lines.

According to one embodiment, a network frequency is 50 Hz or 60 Hz.

In one embodiment, the mobile inspection device according to the second aspect is set up to execute the method according to the first aspect.

Technical functionalities of the mobile inspection device according to the second aspect result directly from corresponding technical functionalities of the method according to the first aspect and vice versa.

Device features therefore result directly from corresponding method features and vice versa.

In the following text, monitoring of a high-voltage line as a power line that carries an electric current in accordance with the concept described here is described by way of example.

Known mobile inspection devices comprise, for example, GPS sensors or else inertial sensors in order to detect the movement of the inspection device in order to compile pieces of position information for a controller, in the case of a drone, for example, for a flight controller. The controller then controls the inspection device by means of path control from an actual position on an intended path of a planned trajectory.

The mobile inspection device according to the second aspect uses in particular also at least one further measurement signal from the measurement object (in this case the high-voltage line) in order to fulfill the control task of active and possibly automatic tracking of the measurement object with a high degree of accuracy.

In the case of the high-voltage line, which is operated, for example, at a network frequency of 50 Hz or 60 Hz, an alternating electric current flows. This alternating electric current generates an electromagnetic field, which is detected by at least one magnetic field sensor of the mobile inspection device.

The (electro)magnetic signal that is to be measured results according to the following: The high-voltage lines have, for example, three phases, which are phase-offset by 120° with respect to one another. Depending on the country, the network frequency is 50 or 60 Hz. That is to say that the electrical voltage and consequently also the electric current in the lines is modulated at 50 or 60 Hz. Since an oscillation has a positive and a negative half-wave, which each have a maximum, two maxima occur 50 or 60 times, that is to say 100 or 120 maxima occur. In this case, the frequency is thus doubled when the energy or the power is taken into consideration.

It holds true that $\sin^2(x)=\frac{1}{2}(\sin(2x)+1)$.

The shift of the 2 from the exponent to the argument of sine is precisely the frequency doubling that the transition from the amplitude of the electrical AC voltage to the electrical power represents.

Therefore, the mobile inspection device can also be coupled functionally to the function of the high-voltage line using a sufficiently rapid magnetic field sensor. This has the technical advantage that functional instances of damage, in particular instances of insulation damage, which result in voltage flashovers, can be detected.

These voltage flashovers are usually accompanied by a flash of light, which contains large proportions of UV radiation due to the excitation and ionization of air molecules. The UV radiation of the flash of light can be used to prove a corona effect. A UV camera (or UV cameras) can be used for this purpose.

That is to say that the corona can be observed, that is to say can be detected, at double the network frequency as long as the breakdown does not exhibit an asymmetry on account of any effects. It could then be the case that it is seen only at the simple network frequency.

Due to the three phases that are offset with respect to one another, it is then the case that, in one complete oscillation cycle of the voltage, that is to say 20 ms at 50 Hz in each phase of the line, two maxima, that is to say six maxima in total, arise. These are distributed evenly over time. That is to say that provision is made, for example, for six images to be captured in 20 ms, which corresponds to an image sequence of 300 Hz. In the case of the 60 Hz network frequency, it is then even 360 Hz, that is to say always a factor of two for each phase and that times the number of phases as a factor for the network frequency. In the case of three phases, this then makes a factor of six.

The following text further explains when a pronounced corona occurs in the cycle. Without dealing with plasma physics in further detail now, some fundamental effects or causes nevertheless ought to be explained as follows.

The corona is a voltage breakdown in the air. The voltage flashover can arise from a specific voltage (the breakdown voltage) depending on a magnitude of the defect in the insulation. Smaller defects will then arise only at higher voltages. There is thus maximum sensitivity close to the maximum of the network voltage—to be taken into consideration separately for each phase! Each insulator sits only in one phase. Depending on the severity of the defect, the corona ignites at a specific voltage. In the arc, the air is then ionized, which produces further ions and therefore further conductive ions. The conductivity in the ionized air is thus increased; the ions move in the electric field. In this case, they collide with other molecules. Overall, the result is then excitation of atomic electrons into excited states in the air molecules, that is to say predominantly of nitrogen and oxygen. When the excited states then degrade again, the radiating transitions emit a flash of light, which becomes the corona due to the plurality of occurrences. Since the ions increase the conductivity of the air due to the voltage breakdown in the air, the corona still exists when the voltage in the line decreases again. The corona effect is therefore offset and somewhat delayed in terms of time with respect to the maximum.

This results in the exposure of the camera advantageously beginning, in particular, at or (very) shortly before the maximum of the network voltage on the line of one of the phases. In particular, a beginning of the exposure occurs $\frac{1}{3}$ of the exposure time before and/or in particular $\frac{2}{3}$ of the exposure time after the maximum.

In order for the pieces of information (phase of the high-voltage line and the oscillation or network frequency) to be available for the exposure of the camera, provision is made for the magnetic field to be measured using a magnetic field sensor.

Measuring a magnetic field by means of a magnetic field sensor is based, for example, on the Hall effect and/or the magnetoresistive (MR) effect, for example the AMR (anisotropic magnetoresistive) effect and/or the GMR (giant magnetoresistive) effect. Magnetic field sensors that are based on the GMR effect have many advantages and are thanks to the automotive industry robust commodities and very favorable. They also have the advantage that a temperature can be measured implicitly and said temperature can even be canceled out again in the measurement. A multifunctional sensor system for indirect magnetic field measurements is therefore available.

A further technical effect is that the magnetoresistive magnetic field sensors in one plane even measure a field direction of the magnetic field. Hall sensors measure only a projection of the magnetic field onto a semiconductor module of the Hall sensor in a direction perpendicular to the current direction. This means that in particular two Hall sensors are needed in order to replace one MR sensor.

In one embodiment, provision is made for at least two MR sensors to be used, wherein these are arranged in such a way that a 3D field direction can be measured in space.

The MR sensors are also fast, that is to say they can also measure the frequency of the magnetic field and therefore the network frequency efficiently.

In particular, provided as a magnetic field sensor is an optical quantum-magnetic field sensor, which advantageously is very sensitive and therefore very suitable for the concept described here.

MR and Hall sensors also have the advantage of a low energy consumption.

The magnetic field around an elongate conductor, which can be approximated as a high-voltage line, is shown in concentric rings around the conductor, where the direction of the field lines is then reversed from half-wave to half-wave.

That is to say the conductor is perpendicular on the plane of a field line, that is to say in the normal plane of the field direction at the measurement location. If the field direction is thus measured at two locations, the normal planes intersect in the axis of the conductor when the field is not distorted by dielectrics and interference effects. The fact that no distortion takes place in the case of air is assumed as a first approximation in the present case.

In accordance with one embodiment, for the measurement of the magnetic field, provision is made for the mobile inspection device to have two magnetic field sensors with a known spatial arrangement and orientation. The location of the high-voltage line can then be determined by means of triangulation and the distance from the inspection device can also be identified easily by means of the angular relationship of the field directions in the measurement plane.

The field direction then alternates from phase to phase of the high-voltage line, since the individual conductors in the high-voltage line are physically separated and the field strength is modulated in a sinusoidal manner. This is taken into account in the evaluation, for example.

Using this information relating to the phase, the camera can then, for example, be triggered and the images can be captured efficiently as early as at the appropriate time where a corona discharge can also be expected in the respective phase.

Provided the camera does not have a frame rate of 300 Hz, for example, provision is made, for example, for the triggering to be used intelligently and for the frame rate of the camera to be utilized skillfully in such a way that the six times relating to the network phase are caught as quickly as possible one after another and as little waiting time as possible exists between the frames. Since the time intervals from one peak to the next are only a good 3 ms, a maximum 6 ms would have to be waited, which is around 160 Hz frame rate. If the camera is even slower, the waiting in terms of time does not really carry any more weight.

Since the intensity of the UV radiation of a corona is low and the distance from the camera is greater if anything, the light is generally detected only from a very small and thus low solid angle. It may therefore be necessary that a camera image is integrated over a plurality of possible corona discharges. This can be carried out in several ways: a) Brute force: increasing the exposure time. b) Multiple exposure of a frame always at the times where a corona is expected in order to thus optimize the signal-to-noise ratio (SNR). Each of the phases of the line then has other times for the corona. c) Rapid exposure of individual frames, which are then subsequently added, in order to thus optimize the SNR and minimize the read-out noise by means of averaging. d) Like c), only that the frames are still shifted with respect to one another for addition in order to thus be able to compensate for the movement effects of the inspection device, which is typically moved along the measurement object (in this case the high-voltage line) with a steady movement. The location of the signal can thus be improved. This addition of the partial images to form the overall image can then be effected using one or more stitching methods. e) In c) and d), the pieces of information of the magnetic field sensor can then also be used in order to determine which phase is currently active and close to the maximum, since only one corona will arise. When the magnetic field sensor is aligned with respect to the (UV) camera in a known manner, only the regions that match the angular range in which a corona can arise can be read out from an image sensor of the camera as region of interest (ROI). By using ROI, an image sensor of the camera can be read out at a significantly higher speed, which then helps a lot, in particular, in c) and d). The position of the ROI can then also change dynamically from frame to frame on account of the magnetic field measurement depending on the quality of a path control of the inspection device.

By measuring the magnetic field and the field direction, it is advantageously made possible to determine which power line or which line bundle (in the case of a plurality of line bundles) currently has a maximum magnetic field.

As a result, a piece of information about the region of an image in which a flash of light needs to be sought is obtained, since a camera is also actually only an angle sensor for a beam direction. If the magnetic field sensor, for example the MR sensor, is thus coupled—by means of the structure—to the camera, for example to the UV camera, the magnetic field sensor of the camera can provide the piece of information about the image height at which a corona effect can be expected. Quick defect recognition and also defect recognition with real-time capability are possible—for example by means of coupled FPGA-based image evaluation in the mobile inspection device itself.

Based on the magnetic field data, a piece of direction information can then be provided to the FPGA, which then uses said piece of direction information for an ROI evaluation in the image. Evaluating and reading out and processing less data reduces an electrical energy consumption of the mobile inspection device and can thus protect an energy store, for example a rechargeable storage battery, of the inspection device.

Therefore, for example, the technical effect that a range of the inspection device can be increased efficiently can be brought about.

The rapid recognition of the defect also has the technical advantage that a close-up capture of the defect can be captured immediately after defect recognition in order to carry out immediate detail checking. In this case, for example, a close-up capture movement path, which is automatically departed when a defect is identified, can be stored in a controller of the inspection device.

It is thus advantageously possible to carry out a prompt evaluation with low latency.

Insulation defects, which are generally the most critical faults or defects, can therefore be identified quickly and reliably. Insulation defects also immediately entail line losses and therefore immediately directly cost money for the network operator. These disadvantages can also be minimized on account of the rapid defect recognition.

In one embodiment, a plurality of magnetic sensors are provided, which each measure a field direction of the magnetic field, with the result that, based on the respective measured field directions, a translation is carried out in order to identify a location or a position of the power line and optionally additionally to identify a distance from the power line or the power lines. A movement of the inspection device is controlled based on the location of the power line and optionally on the distance, for example. In the case of an aircraft, for example, a flight, in particular a height and a position, is controlled.

It is thus possible for example to keep a distance from the power line constant, such that the power line can be captured independently of a possible bending, which thus leads to an approximately constant size of the individual components in the image. This further improves the capture and the processing of the measurement data or measurement signals. Furthermore, the signals of the magnetic field sensor are simpler to evaluate and can be evaluated with a lower degree of computational outlay than an image evaluation, which then makes possible larger ranges given the same rechargeable storage battery capacity in the case of the limited electrical energy of a mobile inspection device.

In one embodiment, provision is made for the evaluation of the magnetic field measurement and the evaluation of the captured image to continue to be carried out still during an operation of the mobile inspection device, which can also be referred to as "on-the-fly" (in the case of an aircraft) or "live" evaluation. This has the technical advantage, for example, that the captured image does not have to be a stereo image. Instead, a mono image is sufficient. The camera can thus be a mono camera and does not have to be a stereo camera. Orientation can take place by means of the image and the magnetic signal can be used to identify a distance and a direction with respect to the power line.

In one embodiment, the camera is a TOF camera. In this case, a "time of flight" measurement is thus carried out by means of the camera. "Time of flight" can be replaced by "propagation time". A propagation time measurement is thus carried out. This also increases data security by way of an independent measurement principle.

In one embodiment, provision is made for the mobile inspection device to comprise an adjustable camera holder, to which the camera is secured.

In one embodiment, provision is made for the adjustable camera holder to be controlled based on the captured image and/or based on the measured magnetic field in such a way that a specific region or a specific location is retained in the image, that is to say is retained in the capture region of the camera.

Such active control advantageously makes it possible that the security regions at the image edge can be reduced with respect to undesired cropping, such that either at the same sensor size of the camera the magnification and thus the resolution can be increased or the sensor size can be reduced in order to thus reduce the amount of data.

In one embodiment, the mobile inspection device comprises an acoustic sensor, which can be of capacitive, inductive, piezoelectric or optical construction, for example, in order to detect the airborne sound.

This thereby brings about the technical advantage, in particular, that a corona can also be detected acoustically. Since during the discharge, the air is temporarily significantly heated up by the discharge, acoustic signals also result. These acoustic signals can then be detected efficiently using the sound sensor.

In one embodiment, provision is made for the phase position of the AC voltage to be used, said AC voltage being identified by means of the magnetic field sensor in order to identify a time when the corona can be detected acoustically by means of the acoustic sensor. An estimation based on the concrete phase position of the AC voltage is thus provided, in the case of which phase position a breakdown takes place before a maximum of the voltage or the energy of the magnetic field. Provision is made, in particular, for the identified time of the sound detection of a breakdown (and/or of a corona) to be corrected in order to take into account a propagation time of the sound from the affected power line or a group of power lines (bundle) to the sound sensor (acoustic sensor) or to the mobile inspection device. It is thus advantageously possible to further increase a degree of measurement accuracy.

The following holds true:

$$t\_corona = t\_sound\ signal - distance\_inspection\ device-power\ line/speed\ of\ sound,$$

wherein t_corona is the time of the occurrence of the corona, wherein t_sound signal is the time of the detection of the sound signal, wherein distance_inspection device-power line is the distance between the inspection device (or the sound sensor) and the power line or the group of power lines.

The phase position of the corona (phase_corona) then results via the relationship:

$$phase\_corona = 2*Pi*t\_corona*network\ frequency,$$
when the amplitude of the AC voltage passes through a zero crossing in the case that $t\_corona=0$.

In one embodiment, the nominal voltage of the power line is known. As a result thereof, the breakdown voltage can advantageously be estimated efficiently and thus a severity or magnitude of the defect can be determined efficiently.

In one embodiment, provision is made for a breakdown voltage to be identified or estimated based on the nominal voltage of the power line.

In one embodiment, provision is made for a magnitude or a severity of the defect in the insulation of the power line to be determined based on the identified breakdown voltage or based on the estimated breakdown voltage.

The breakdown voltage (U_breakdown) is then determined via:

$$U\_breakdown = U\_max*\sin(phase\_corona) = U\_max*\sin(2*Pi*t\_corona*network\ frequency),$$

wherein U_max is the nominal voltage.

It is thus advantageously possible to prioritize identified defect locations for later repair.

This functional evaluation of defects is not possible, for example, in the prior art in accordance with DE 10 2015 221 600 A1 mentioned in the introduction to the description.

In the real measurement operation, in the case of high-voltage lines, it regularly occurs that discharges take place also between the lines via the air quasi permanently. These constitute a basic level of noise—mostly even in a manner dependent on the humidity because this correlates inversely to the insulation capability of the air. A corona manifests when, at a specific time from the zero crossing of the phase of the AC voltage, a greater signal that is also located temporally in the measured signal occurs.

In one embodiment, provision is made for it to be determined that a breakdown or a corona has been detected based on the acoustic signal when an intensity of the acoustic signal is greater or greater than or equal to a predetermined acoustic threshold value.

In one embodiment, a plurality of acoustic sensors are provided, wherein these are arranged in a known geometry.

In one embodiment, a triangulation is carried out based on the known geometry and the respective measured acoustic signals in order to identify a location of the source of the acoustic signals.

Given an assumed speed of sound of approximately 300 m/s, it is possible to measure here with a sufficiently accurate time resolution. Given a time resolution of 1 ms, the location can be determined accurately to approximately 0.3 m, at 10 μs resolution to 3 mm. It is then even possible to advantageously determine which line in a line bundle is affected by a defect, which a magnetic field sensor cannot do alone.

In one embodiment, provision is made for the acoustic signals to be referenced or to be correlated with the magnetic signals in order to thus prevent possible erroneous detections.

For the measurement of a breakdown voltage, in particular only those acoustic signals that are recognized or detected in an increasing range of the AC voltage are used or taken into account. If a defect is involved, the signal should be recognized in each full period of the voltage. The signals of positive and negative half-wave can be different at the time of occurrence. This asymmetry can also be evaluated as a characteristic of the defect.

The coincidence of the sound signal and the magnetic phase position can be executed as a two-phase measurement. This two-phase measurement is used on the one hand to measure more accurately and also to detect an erroneous measurement (more) reliably.

In general, it is important or advantageous and thus also provided in accordance with one embodiment that there is as little coupling of a control and drive technology of the inspection device into the measurement sensor system (acoustic sensor, magnetic field sensor, camera) as possible. The coupling-in can be optimized and/or minimized in various ways.

One embodiment makes provision for the individual critical elements in the frequency range of interest to be shielded accordingly. For example, the drive technology and/or the control technology do not have any electrical signals in the range of the network frequency and the harmonics thereof. In particular, the measurement signals can then be filtered appropriately using a bandpass for the network frequency. As an alternative or in addition, the control technology is configured in such a way that the network frequency including the harmonics are not used in the control and thus no interference signal is generated in this frequency range. The same also applies accordingly to a drive technology that can comprise, for example, an actuation system of one or more drives. It is thus possible, for example, in the case of an aircraft comprising one or more propellers, for provision to be made for this to be driven at frequencies that are different from the network frequency and harmonics.

In the context of the description, a power line may be coated or may not be coated, that is to say may be free from a coating.

An insulation can be formed, for example, as a coating around the power line.

An insulation can, for example, comprise an insulator on a pylon or can be formed as such an insulator, wherein the power line is secured to the pylon.

A defect on an insulation of the power line can thus be, for example, a defect on the insulator and/or on the coating.

BRIEF DESCRIPTION OF THE DRAWINGS

The above-described properties, features and advantages of this invention and the way in which they are achieved will become clearer and more distinctly comprehensible in connection with the following description of exemplary embodiments which are explained in more detail in connection with the drawings, in which.

DETAILED DESCRIPTION OF INVENTION

Figure 1:
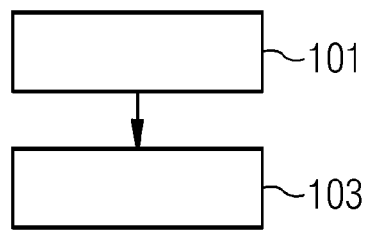
FIG. 1 shows a flowchart of a method for monitoring a power line that carries an electric current in accordance with a first embodiment.

FIG. 1 shows a flowchart of a method for monitoring a power line that carries an electric current in accordance with a first embodiment.

The method is carried out using a mobile inspection device. The mobile inspection device comprises a magnetic field sensor and a camera.

The method comprises the following steps: measuring 101 a magnetic field that is generated by the current, by means of the magnetic field sensor, and capturing 103 an image of the power line by means of the camera depending on the measured magnetic field.

Figure 2:
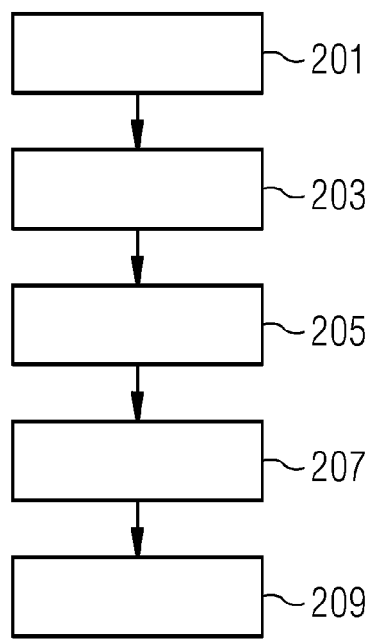
FIG. 2 shows a method for monitoring a power line that carries an electric current in accordance with a second embodiment.

FIG. 2 shows a flowchart of a method for monitoring a power line that carries an electric current in accordance with a second embodiment.

The method is carried out using a mobile inspection device. The mobile inspection device comprises a magnetic field sensor, a camera and an acoustic sensor, by means of which an airborne sound can be measured.

The method comprises measuring 201 a magnetic field that is generated by the current, by means of the magnetic field sensor.

The method further comprises identifying 203 a phase and a frequency of the electric current based on the measured magnetic field.

The method comprises measuring 205 an airborne sound by means of the acoustic sensor.

The method comprises evaluating 207 the measured airborne sound based on the identified phase and the identified frequency in order to detect an acoustic signal resulting from a voltage flashover.

The method comprises capturing 209 an image of the power line by means of the camera depending on the measured magnetic field.

Figure 3:
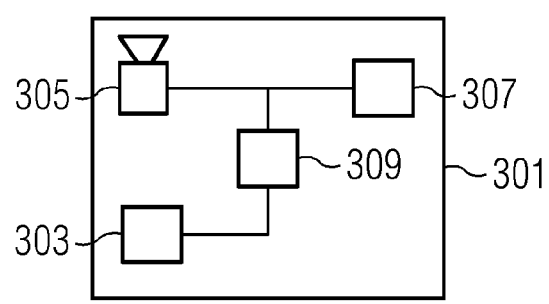
FIG. 3 shows a mobile inspection device in accordance with a first embodiment.

FIG. 3 shows a mobile inspection device 301 for monitoring a power line that carries an electric current.

The mobile inspection device 301 comprises a magnetic field sensor 303, which is set up to measure a magnetic field that is generated by the current.

The mobile inspection device 301 also comprises a camera 305, which is set up to capture an image of the power line depending on the measured magnetic field.

The mobile inspection device 301 also comprises an acoustic sensor 307, which is set up to detect or to measure an airborne sound.

The mobile inspection device 301 also comprises a controller 309, which is set up to control the mobile inspection device 301. For example, the controller 309 is set up to control a movement of the mobile inspection device 301.

The control device 309 is set up, for example, to control the mobile inspection device 301 based on the measured magnetic field and/or based on the captured image and/or based on the measured airborne sound.

For example, the control device 309 is set up to identify capture parameters for the camera 305 based on the measured magnetic field.

For example, the control device 309 is set up to control the camera 305 based on the identified capture parameters in order to capture an image of the power line.

Capture parameters for example comprise: an exposure time and/or a trigger time.

The control device 309 is set up, for example, to execute or to control one or more steps of the method in accordance with the first aspect.

In accordance with one embodiment, the mobile inspection device 301 is an aircraft, for example a drone, for example a quadcopter. In such a case, the control device 309 is a flight control device, for example.

Figure 4:
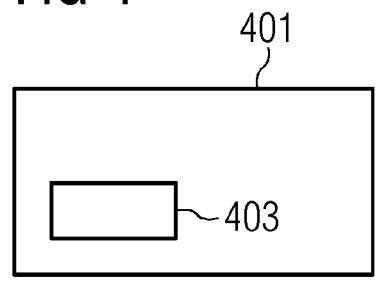
FIG. 4 shows a machine-readable storage medium and FIG. 5 shows a mobile inspection device in accordance with a second embodiment.

FIG. 4 shows a machine-readable storage medium 401.

A computer program 403 is stored on the machine-readable storage medium 401. The computer program 403 comprises commands that prompt a computer, for example the control device 309 of the mobile inspection device 301 in accordance with FIG. 3, to carry out a method in accordance with the first aspect when the computer program 403 is executed by said computer.

Figure 5:
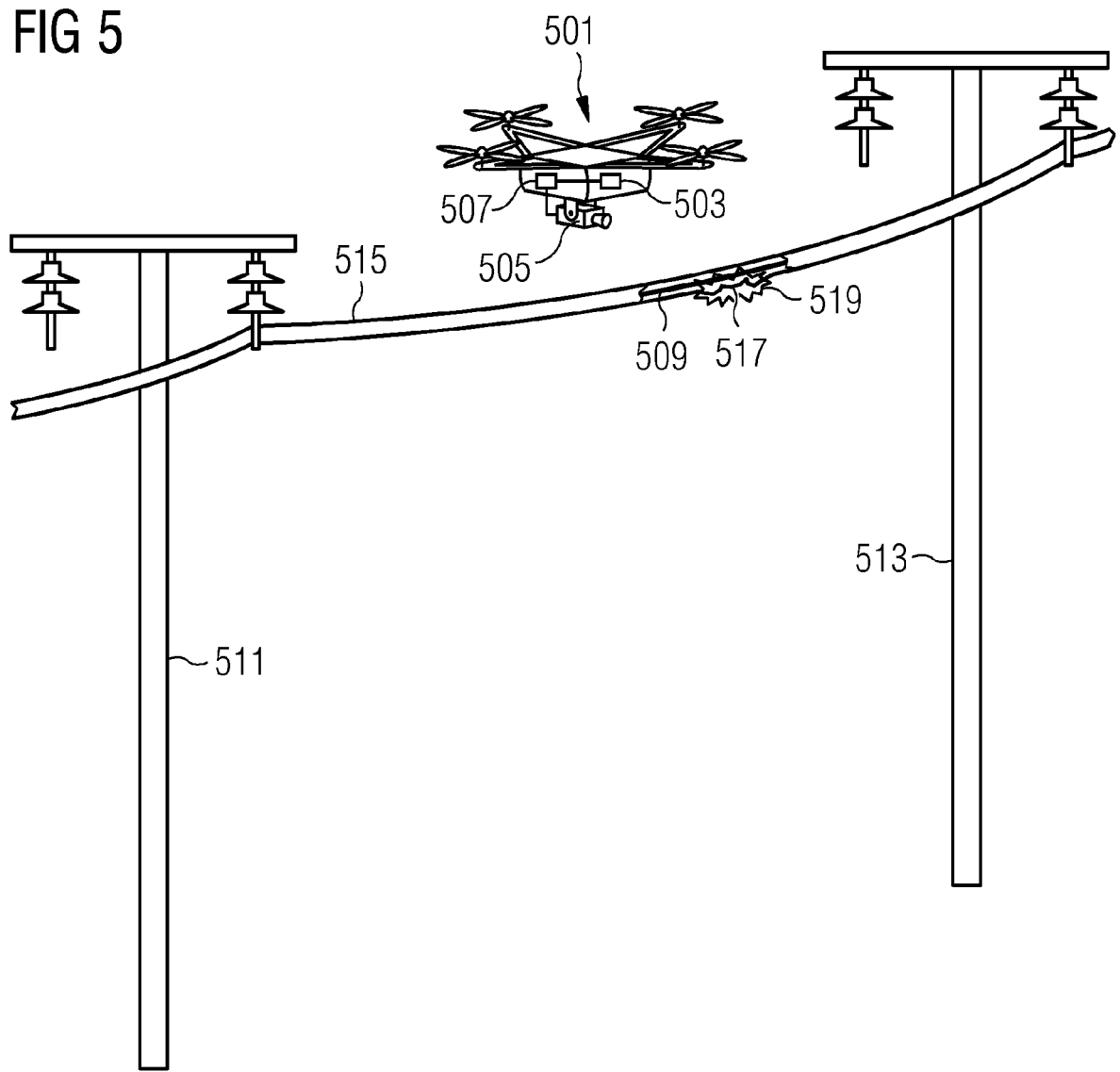

FIG. 5 shows a mobile inspection device 501 in accordance with a second embodiment, wherein the mobile inspection device 501 is formed as a drone.

The drone 501 comprises a magnetic field sensor 503, a camera 505 and a control device 507. The control device 507 is designed as a flight control device. That is to say that the control device 507 can thus control a flight of the drone 501.

The drone 501 monitors a power line 509 that carries an electric current and comprises an insulation 515. The electric current that flows through the power line 509 is an alternating current.

The power line 509 runs between a first pylon 511 and a second pylon 513, wherein the power line 509 is secured to the first pylon 511 and to the second pylon 513.

The insulation 515 comprises a defect 517, at which voltage breakdowns or voltage flashovers can arise.

Said voltage flashover is accompanied by a flash of light 519, which can also be referred to as a corona.

The magnetic field sensor 503 measures a magnetic field that is generated by the electric current, with the result that a phase and a frequency of the electric current can be identified thereby.

It is thus possible to estimate when and at which location a flash of light can be expected, provided there is a defect at the corresponding location of the power line 509 in the insulation 515.

The camera 505 can therefore be operated efficiently in such a way that it captures one or more images of the power line 509 at the identified time.

Furthermore, for example, the control device 507 can control the drone 501 in such a way that it controls the identified location in such a way that the camera 505 can also detect this location.

In an embodiment that is not shown, the drone 501 comprises one or more acoustic sensors for measuring an airborne sound, as described above.

Advantages of the concept described here are further explained below:

From the measurement using the additional sensor(s) (magnetic field sensor and optionally acoustic sensor), a) more information about the measurement object, in this case the power line, can be obtained, b) the measurements can also initially be coupled to the functional state of the measurement object in order to also thus perform not only geometric measurements with an increased degree of precision but also to be able to perform functional evaluations, c) based on the measurement signals of the additional sensors the measurement object itself can be tracked and followed by the inspection device and not only static routes based on, for example, predetermined GPS coordinates can be followed.

One example is the reliable detection of corona effects also on the side facing away from the camera when a sound sensor (acoustic sensor) is used, which can acoustically detect a voltage flashover, wherein, for example, a coincidence of acoustic and magnetic signal is utilized and/or wherein the sound signal is checked for a quasi-periodicity at the network frequency or even double the network frequency in order to check the measured sound signal to determine whether a voltage flashover is the source for the sound signal or not. This can be carried out, for example, using a continuously performed Fourier transformation, which then has a respective maximum at the corresponding frequencies.

The multi-modal measurement (a plurality of different sensors) makes the measurement more reliable, for example using the approach of a two-phase measurement. More modalities often obtain additional data or more accurate data in relation to at least one feature, in this case, in particular, the detection of a defect in the insulation.

The detection of the functional state (phase and frequency of the electric current) is carried out by means of the magnetic field sensor. In specific weather conditions, this can also be carried out based on an acoustic measurement by means of the acoustic sensor in order to detect network humming.

Furthermore, in comparison to the camera measurement, the acoustic measurement can also detect defects in insulator components (overall: insulation) that are located on the rear side of the component, as seen from the camera. For example, the sound sensor is sensitive to aspects of the function since it can receive the sound signals that can occur, for example, in the case of an insulation fault with discharge. The verification of the sound signal can be ensured by means of the function of the line since it is also known—a priori—that discharges arise only at higher voltages.

In general, the detection capability of the measurement system can thus be increased or even basically extended by the multi-modal detection together with the coupling to the functional parameters of the measurement object.

New uses specifically for the application of the monitoring of a power line with detection of defects can be provided, such as for example:

Location of the power line in space.

Determination of the distance between the inspection device or the corresponding sensor and the power line or a part of the power line.

Recognition of which power line or which bundle of conductors of the power lines is in which phase position.

Assignment of a corona to a power line or to an insulator that carries the power line.

Improvement of the signal-to-noise ratio of the measurements by way of adjusting the measurement times to the functional state of the measurement object (in the context of a lock-in principle from the measurement technology), that is to say, for example, capturing an image of a location of the power line while a phase of the electric current passes through a maximum at said location.

Although the invention has been described and illustrated in more detail by way of the preferred exemplary embodiments, the invention is not restricted by the disclosed examples and other variations may be derived therefrom by a person skilled in the art without departing from the scope of protection of the invention.

The invention claimed is:

1. A method for monitoring a power line that carries an electric current, using a mobile inspection device, wherein the mobile inspection device comprises a magnetic field sensor and a camera, said method comprising:
measuring a magnetic field that is generated by the current, by the magnetic field sensor, and
capturing an image of the power line by the camera depending on the measured magnetic field;
wherein the electric current is an alternating current,
wherein a phase and/or a frequency of the electric current is identified based on the measured magnetic field,
wherein the camera captures the image based on the identified phase and/or the identified frequency.

2. The method as claimed in claim 1,
wherein the capturing of an image comprises multiple exposure of a frame.

3. The method as claimed in claim 1,
wherein the capturing comprises exposure of multiple individual frames, which are added.

4. The method as claimed in claim 3,
wherein the multiple frames are shifted with respect to one another for the addition in order to compensate for a movement of the mobile inspection device.

5. The method as claimed in claim 1,
wherein, for the capturing of the image, only a specific subregion of an image sensor of the camera is read out depending on an alignment of the magnetic field sensor relative to the power line.

6. The method as claimed in claim 1,
wherein the mobile inspection device comprises at least one acoustic sensor, by means of which an airborne sound is measured,
wherein the measured airborne sound is evaluated based on the identified phase and/or the identified frequency in order to detect an acoustic signal resulting from a voltage flashover.

7. The method as claimed in claim 6,
wherein a plurality of acoustic sensors are provided,
wherein a triangulation is carried out based on the respective measured airborne sound in order to locate a source of the acoustic signal.

8. The method as claimed in claim 6,
wherein a phase position of the electric current at the time of the detected voltage flashover is identified,
wherein a breakdown voltage is identified based on the identified phase position and a nominal voltage of the power line.

9. The method as claimed in claim 1,
wherein the captured image is evaluated in order to detect a voltage flashover,
wherein, upon detection of a voltage flashover, the mobile inspection device and/or the camera are controlled in such a way that a location of a source of the detected voltage flashover can further be captured by means of the camera.

10. The method as claimed in claim 1,
wherein control signals for controlling a movement of the mobile inspection device are generated and output based on the measured magnetic field in order to move the mobile inspection device along a course of the power line.

11. A mobile inspection device for monitoring a power line that carries an electric current, comprising:
a magnetic field sensor, which is set up to measure a magnetic field that is generated by the current, and
a camera, which is set up to capture an image of the power line depending on the measured magnetic field,
wherein the electric current is an alternating current,
wherein a phase and/or a frequency of the electric current is identified based on the measured magnetic field,
wherein the camera captures the image based on the identified phase and/or the identified frequency.

12. A non-transitory machine-readable storage medium, comprising:
a computer program stored thereon,
the computer program comprising commands that prompt a computer to execute a method for monitoring a power line that carries an electric current, wherein the electric current is an alternating current, using a mobile inspection device, wherein the mobile inspection device comprises a magnetic field sensor and a camera, when the computer program is executed by said computer, the method for monitoring comprising:
receiving a measurement of a magnetic field that is generated by the current, measured by the magnetic field sensor,
identifying a phase and/or a frequency of the electric current based on the measurement of the magnetic field,
receiving a captured an image of the power line, captured by the camera depending on the measured magnetic field, wherein the camera captures the image based on the identified phase and/or the identified frequency, and
monitoring the power line based on the captured image.

* * * * *